(12) United States Patent
Kuwahara et al.

(10) Patent No.: US 7,384,258 B2
(45) Date of Patent: Jun. 10, 2008

(54) DIE FOR FORMING HONEYCOMB STRUCTURE, AND METHOD OF MANUFACTURING THE SAME

(75) Inventors: Hiroshi Kuwahara, Nagoya (JP);
Susumu Matsuoka, Nagoya (JP);
Takao Saito, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/174,657

(22) Filed: Jul. 6, 2005

(65) Prior Publication Data

US 2006/0018988 A1  Jan. 26, 2006

(30) Foreign Application Priority Data

Jul. 9, 2004  (JP) .............................. 2004-203394

(51) Int. Cl.
*B29C 47/12* (2006.01)

(52) U.S. Cl. ................. 425/380; 264/177.12; 425/461; 425/467; 427/249.7; 427/249.8; 427/249.14; 427/249.18

(58) Field of Classification Search ........... 264/177.12; 425/380, 461, 464, 466, 467; 427/249.7, 427/249.8, 249.14, 249.18
See application file for complete search history.

(56) References Cited

U.S. PATENT DOCUMENTS

| 4,861,626 | A | * | 8/1989 | Ihara et al. ................. 427/133 |
| 4,980,201 | A | | 12/1990 | Tokunaga et al. |
| 5,070,588 | A | * | 12/1991 | Miwa et al. ................ 76/107.1 |
| 6,193,497 | B1 | * | 2/2001 | Suzuki ........................ 425/380 |
| 6,315,545 | B1 | * | 11/2001 | Inoue ..................... 425/192 R |
| 6,723,448 | B2 | * | 4/2004 | Asai et al. ................... 428/544 |
| 2002/0172765 | A1 | | 11/2002 | Nakamura et al. ........ 427/249.7 |
| 2004/0076707 | A1 | | 4/2004 | Matsumoto et al. ........ 425/461 |
| 2005/0031727 | A1 | | 2/2005 | Matsuoka et al. .......... 425/461 |

FOREIGN PATENT DOCUMENTS

| DE | A 195 21 007 | 12/1995 |
| JP | A 61-270372 | 11/1986 |
| JP | A 04-275805 | 10/1992 |
| JP | A 2002-339068 | 11/2002 |
| JP | A 2003-171758 | 6/2003 |
| WO | WO 03/039828 A1 | 5/2003 |

* cited by examiner

*Primary Examiner*—James P. Mackey
*Assistant Examiner*—Joseph Leyson
(74) *Attorney, Agent, or Firm*—Oliff & Berridge, PLC

(57) ABSTRACT

There is disclosed a die 1 for forming a honeycomb structure comprises: a plate-like die substrate 2 having at least two surfaces 8, 9, in which back holes 3 for introducing a green material are formed in one surface 8, and slits 4 communicating with back holes 3 are formed in the other surface 9; an underlayer 5 disposed on the substrate 2 so as to coat at least a part of a portion constituting the back hole 3 and the slit 4; an intermediate layer 6 disposed so as to coat at least a part of the underlayer 5 and constituted of tungsten carbide particles whose average particle diameter is 5 μm or less and containing $W_3C$ as a main component; and a surface layer 7 disposed so as to coat at least a part of the intermediate layer 6 and constituted of diamond and/or diamond-like carbon.

16 Claims, 3 Drawing Sheets

DIE FOR FORMING HONEYCOMB STRUCTURE, AND METHOD OF MANUFACTURING THE SAME

BACKGROUND OF THE INVENTION

1. Field of the Invention

The present invention relates to a die for forming a honeycomb structure, and a method of manufacturing the die, and particularly relates to a die for forming a honeycomb structure, and a method of manufacturing the die in which wear resistance is superior and in which pressure resistance can be reduced to realize sophisticated formability.

2. Description of the Related Art

As a method of manufacturing a honeycomb structure of a ceramic, an extruding method has been heretofore broadly performed using a die (hereinafter referred to simply as the die in some case) for forming a honeycomb structure. The die comprises a die substrate having: a back hole for introducing clay (green material); and a clay extruding slit which communicates with the back hole and which is formed into a lattice form or the like. In this die, usually the back hole for introducing the clay is disposed in an opening having a large area in one surface (surface on a clay introduction side) of the die substrate. The clay extruding slit is disposed into the lattice form or the like having a small width corresponding to a partition wall thickness of the honeycomb structure in the surface on a formed article extrusion side opposite to the clay introduction side of the die substrate. Moreover, each back hole is usually disposed in a position where the latticed clay extruding slits intersect with each other, and the back hole communicates with the slit inside the die substrate. Therefore, the clay formed of a ceramic material or the like introduced from the back hole moves from a clay introducing hole having a comparatively large inner diameter into the clay extruding slit having a small slit width, and is extruded from the clay extruding slit to constitute a formed article having the honeycomb structure.

As this type of die for forming the honeycomb structure, for example, there has been disclosed a die for forming the honeycomb structure, in which a diamond film or a diamond-like carbon film is formed on the surface of the die substrate in order to enhance wear resistance (see Japanese Patent Application Laid-Open No. 2002-339068). There has been disclosed another die for forming the honeycomb structure, in which an underlayer, and a surface layer are formed in this order on the film substrate, and the surface layer is constituted of tungsten carbide particles containing a main component of $W_3C$ and having an average radius of 5 μm or less (see International Publication No. 03/039828).

However, in the die for forming the honeycomb structure, described in Japanese Patent Application Laid-Open No. 2002-339068, there has been a problem that the layer (underlayer), constituting the substrate of the diamond film or the diamond-like carbon film, has low smoothness, this underlayer has a large influence on the smoothness of the diamond film or the diamond-like carbon film formed on this underlayer, this lowers the smoothness of the surface of the die for forming the honeycomb structure, and formability is deteriorated. Especially, there has been a tendency that the formability drops with decrease of the thickness of a partition wall of the formed honeycomb structure. In the die for forming the honeycomb structure, described in International Publication No. 03/039828, pressure resistance is reduced, but further enhancement of the wear resistance has been expected with the thinning of the partition wall of the honeycomb structure to be manufactured.

SUMMARY OF THE INVENTION

The present invention has been developed in view of the above-described problem, and an object thereof is to provide a die for forming a honeycomb structure, which is superior in wear resistance and in which pressure resistance can be reduced to realize sophisticated formability, and to provide a method of manufacturing the die.

According to the present invention, there are provided the following die for forming a honeycomb structure, and a method of manufacturing the die.

[1] A die for forming a honeycomb structure comprising: a plate-like die substrate having at least two surfaces, one surface including a back hole for introducing a green material, the other surface including a slit formed in such a manner as to communicate with the back hole and in which the green material introduced into the back hole is extruded from the slit to form the honeycomb structure; an underlayer disposed on the die substrate in such a manner as to coat at least a part of a portion constituting the back hole and the slit; an intermediate layer disposed in such a manner as to coat at least a part of the underlayer and constituted of tungsten carbide particles containing a main component of $W_3C$ and having an average particle diameter of 5 μm or less; and a surface layer which is disposed in such a manner as to coat at least a part of the intermediate layer and which is constituted of diamond and/or diamond-like carbon.

[2] The die for forming the honeycomb structure according to the above [1], wherein the surface layer is disposed on the die substrate in such a manner as to include a portion where the back hole communicates with the slit.

[3] The die for forming the honeycomb structure according to the above [1] or [2], wherein thickness of the underlayer is in a range of 1 to 100 μm.

[4] The die for forming the honeycomb structure according to any one of the above [1] to [3], wherein thickness of the intermediate layer is in a range of 0.1 to 30 μm.

[5] The die for forming the honeycomb structure according to any one of the above [1] to [4], wherein thickness of the surface layer is in a range of 0.01 to 20 μm.

[6] The die for forming the honeycomb structure according to any one of the above [1] to [5], wherein the tungsten carbide particles constituting the intermediate layer has a maximum particle diameter of 6 μm or less.

[7] The die for forming the honeycomb structure according to any one of the above [1] to [6], wherein the underlayer includes an electroless plating layer.

[8] The die for forming the honeycomb structure according to any one of the above [1] to [7], wherein the intermediate layer is formed by chemical vapor deposition (CVD).

[9] The die for forming the honeycomb structure according to any one of the above [1] to [8], wherein the surface layer is formed by chemical vapor deposition (CVD).

[10] A method of manufacturing a die for forming a honeycomb structure, comprising the steps of: forming a back hole which introduces a green material for forming the honeycomb structure in one surface of a plate-like member having two surfaces, and forming a slit which communicates with the back hole in the other surface of the plate-like member to obtain a die substrate in which the slit is formed; forming an underlayer on at least a part of a portion in which the back hole and the slit are formed on the obtained slit-formed die substrate by a process including electroless plating to obtain the die substrate provided with the underlayer; forming an intermediate layer constituted of tungsten carbide particles containing a main component of $W_3C$ and having an average particle diameter of 5 μm or less on at least a part of the underlayer of the obtained die substrate provided with the underlayer by chemical vapor deposition (CVD) using a first reactive gas containing tungsten hexafluoride ($WF_6$), benzene ($C_6H_6$), and hydrogen ($H_2$) to obtain the die substrate provided with the intermediate layer; and forming a surface layer constituted of diamond and/or diamond-like carbon on at least a part of the intermediate layer of the obtained die substrate provided with the intermediate layer by chemical vapor deposition (CVD) using a second reactive gas containing hydrogen carbide to manufacture the die for extruding the honeycomb structure.

[11] The method of manufacturing the die for forming the honeycomb structure according to the above [10], wherein the chemical vapor deposition (CVD) for forming the intermediate layer is thermal CVD or plasma CVD.

[12] The method of manufacturing the die for forming the honeycomb structure according to the above [11], wherein the intermediate layer is formed by the thermal CVD at a temperature of 310 to 420° C. and a pressure of 1 to 35 Torr.

[13] The method of manufacturing the die for forming the honeycomb structure according to any one of the above [10] to [12], wherein the chemical vapor deposition (CVD) for forming the surface layer is plasma CVD.

[14] The method of manufacturing the die for forming the honeycomb structure according to the above [13], wherein the plasma CVD comprises the steps of: applying a pulse voltage to the die substrate provided with the intermediate layer.

In the present invention, the die for forming the honeycomb structure is superior in wear resistance, and pressure resistance can be reduced to realize sophisticated formability. In the method of manufacturing the die for forming the honeycomb structure of the present invention, the die for forming the honeycomb structure can be provided, and the method can contribute to enhancement of productivity.

DESCRIPTION OF THE PREFERRED EMBODIMENT

Embodiments of a die for forming a honeycomb structure, and a method of manufacturing the die according to the present invention will be described in detail with reference to the drawings. However, the present invention is interpreted without being limited to these embodiments, and the present invention can be variously altered, modified, and improved based on knowledge of a person skilled in the art without departing from the scope of the present invention.

Figure 1:
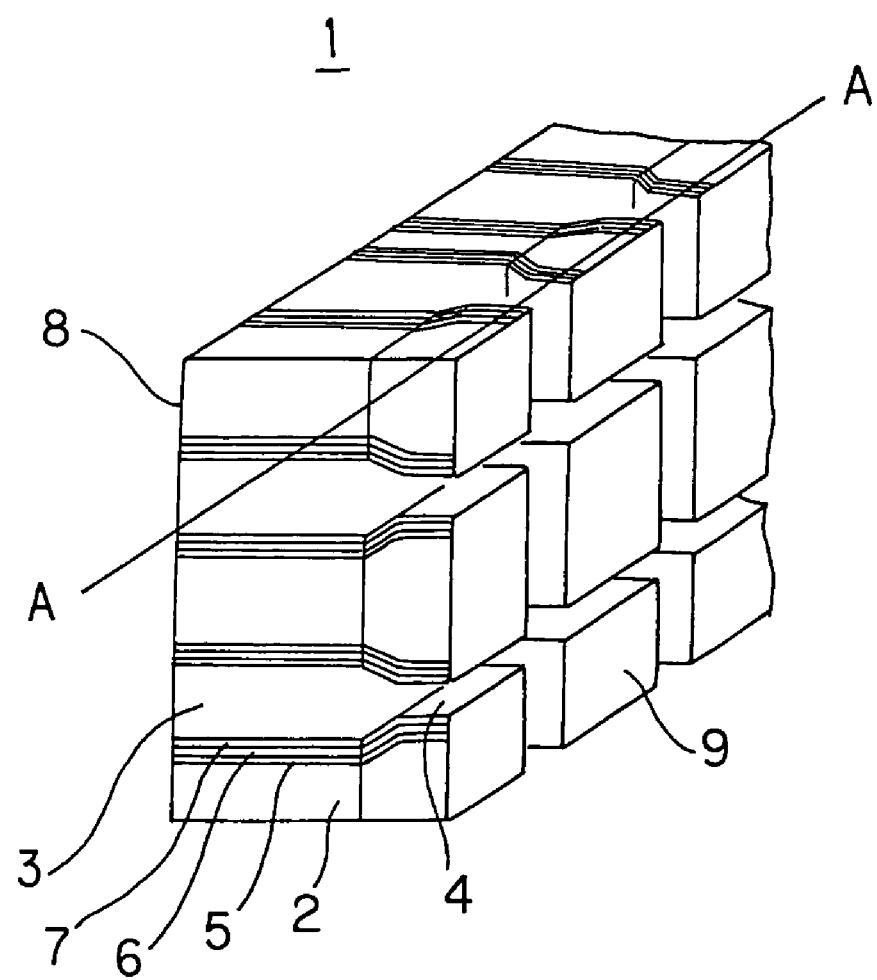
FIG. 1 is a perspective view schematically showing one embodiment of a die for forming a honeycomb structure according to the present invention.
Figure 2A:
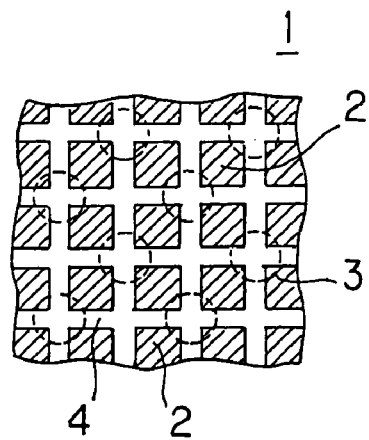
FIG. 2(a) is a sectional view showing the die for forming the honeycomb structure shown in FIG. 1 in a section cut along line A-A.
Figure 2B:
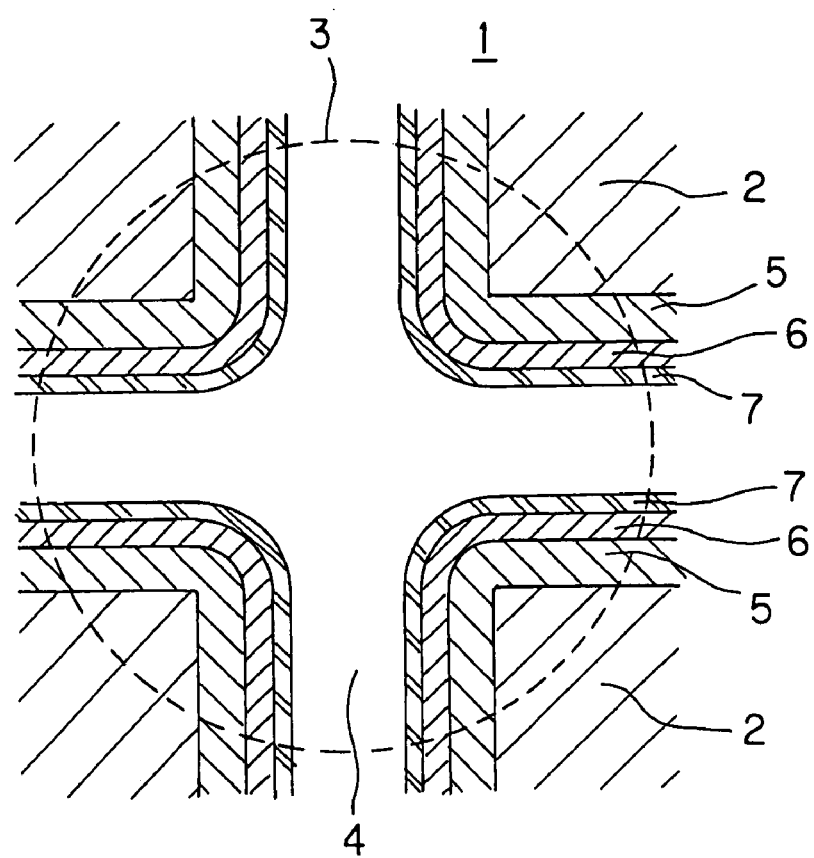
FIG. 2(b) is a partially enlarged view of FIG. 2(a)
Figure 3:
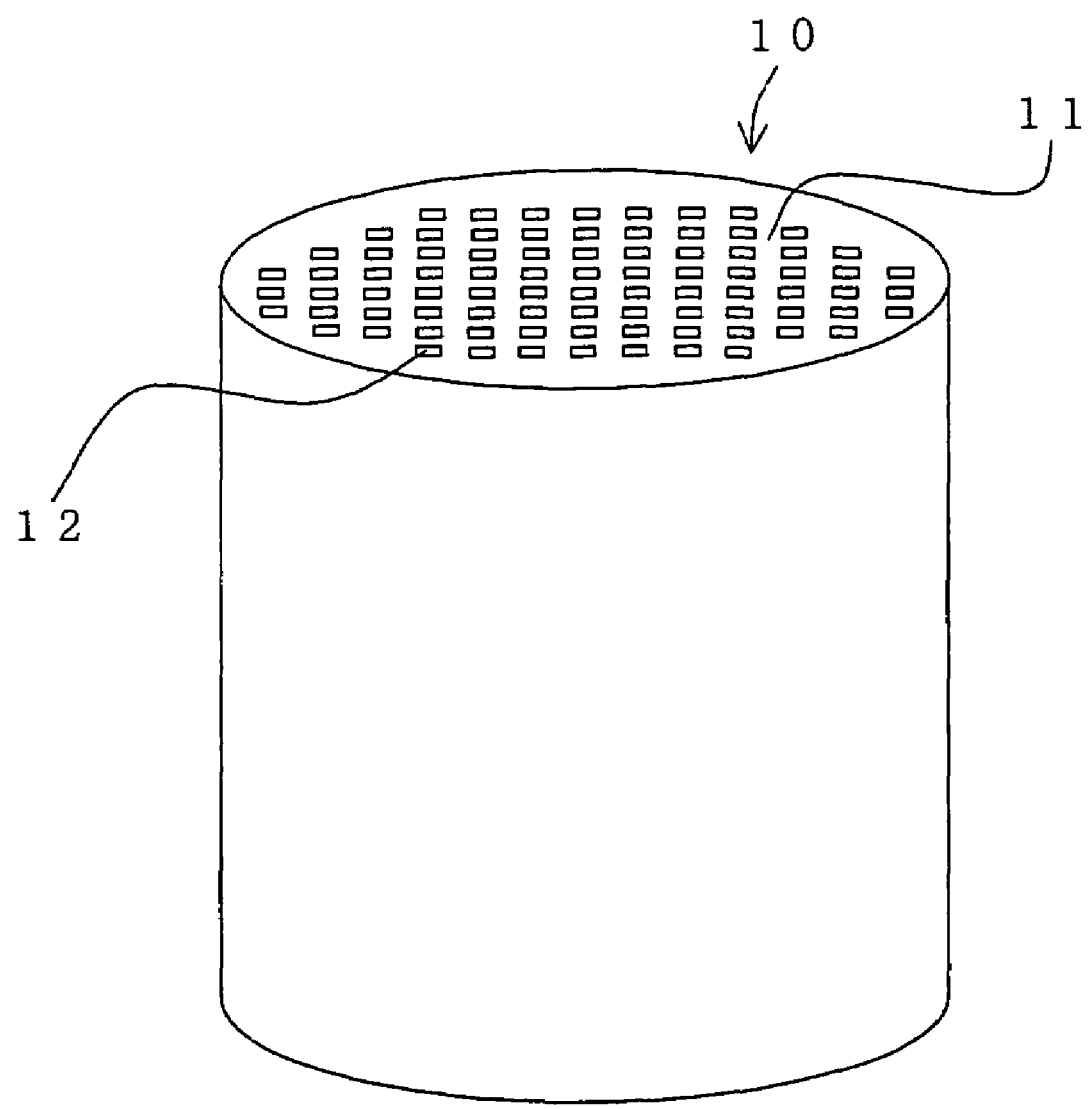
FIG. 3 is a perspective view showing a honeycomb structure extruded by the die for forming the honeycomb structure shown in FIG. 1.

FIG. 1 is a perspective view schematically showing one embodiment of a die for forming a honeycomb structure according to the present invention. FIG. 2(a) is a sectional view showing the die for forming the honeycomb structure shown in FIG. 1 in a section cut along line A-A, and FIG. 2(b) is a partially enlarged view of FIG. 2(a). FIG. 3 is a perspective view showing a honeycomb structure extruded by the die for forming the honeycomb structure according to the present embodiment. As shown in FIGS. 1, 2(a), and 2(b), according to the present embodiment, a die 1 for forming a honeycomb structure comprises a plate-like die substrate 2 having at least two surfaces 8, 9. Back holes 3 for introducing a green material are formed in one surface 8, and slits 4 which communicate with the back holes 3 are formed in the other surface 9. The green material introduced into the back holes 3 is extruded from the slits 4 to form a honeycomb structure 10 (see FIG. 3). The die 1 for forming the honeycomb structure includes: an underlayer 5 disposed on the die substrate 2 in such a manner as to coat at least a part of a portion constituting the back hole 3 and the slit 4; an intermediate layer 6 disposed in such a manner as to coat at least a part of the underlayer 5 and constituted of tungsten carbide particles containing a main component of $W_3C$ and having an average particle diameter of 5 μm or less; and a surface layer 7 which is disposed in such a manner as to coat at least a part of the intermediate layer 6 and which is constituted of diamond and/or diamond-like carbon.

As described above, the die 1 for forming the honeycomb structure reduces a pressure resistance to realize sophisticated formability, and is superior in wear resistance.

As shown in FIG. 3, in the present embodiment, the honeycomb structure 10, extruded by the die 1 (see FIG. 1) for forming the honeycomb structure, has porous partition walls 11, and a plurality of cells 12 defined by the partition walls 11 to constitute fluid channels. This honeycomb structure 10 is preferably usable in a carrier for a catalyst, using a catalyst function of an internal combustion engine, a boiler, a chemical reaction apparatus, a refiner for a fuel cell or the like, a filter for capturing particulates in an exhaust gas and the like.

As shown in FIGS. 1, 2(a), and 2(b), in the die substrate 2 for use in the die 1 for forming the honeycomb structure according to the present embodiment, it is preferably possible to use a die substrate for use in a die for forming a honeycomb structure, which has heretofore been known. Specifically, a plate-like member of a metal, an alloy or the like is preferably usable which has a thickness to such an extent that the back holes 3 are formed in one surface 8, and slits 4 communicating with the back holes 3 can be formed in the other surface 9. Examples of a material of the die substrate 2 preferably include stainless steel, die steel and the like.

The slits 4 formed in the die substrate 2 form a part of the partition wall 11 of the honeycomb structure 10 shown in FIG. 3, and are formed, for example, into a lattice form in accordance with a shape of the partition wall 11 as shown in FIG. 1.

Moreover, the green material for extruding the honeycomb structure 10 (see FIG. 3) is introduced from one surface 8 through the back holes 3, and each back hole is usually formed in a position where the slits 4 intersect with one another. By this constitution, the green material introduced through the back holes 3 can be uniformly spread over all of the slits 4, and sophisticated formability can be realized. It is to be noted that there is not any special restriction as to the specific shapes of the slits 4 and the back holes 3, and the shapes can be appropriately determined in accordance with the shape of the honeycomb structure 10 (see FIG. 3) to be extruded.

There is not any special restriction as to a method for forming the slits 4 and the back holes 3, and it is preferably possible to use a method which has heretofore been known, for example, by electrochemical machining (ECM), electric discharge machining (EDM), drilling or the like. In this case, in the die 1 for forming the honeycomb structure in the present embodiment, as shown in FIGS. 1, 2(*a*), and 2(*b*), the underlayer 5, the intermediate layer 6, and the surface layer 7 are disposed in this order on at least a part of the die substrate 2. Therefore, the slits 4 and the back holes 3 are preferably formed to be larger in such a manner that sizes (widths) of the slit 4 and the back hole 3 are slightly larger than those of the slit 4 and the back hole 3 having final shapes in a position where at least one of the underlayer 5, the intermediate layer 6, and the surface layer 7 is disposed, that is, in consideration of thicknesses of the underlayer 5, the intermediate layer 6, and the surface layer 7, and positions where the layers are to be disposed.

In the present embodiment, the underlayer 5 constituting the die 1 for forming the honeycomb structure assists bonding between the die substrate 2 and the intermediate layer 6. There is not any special restriction as to a material of the underlayer 5, but a bonding strength is high with respect to the intermediate layer 6, and therefore the underlayer is preferably formed of a material containing at least one metal selected from a group consisting of nickel, cobalt, and copper. The underlayer is further preferably formed of a material containing nickel which has an especially high bonding strength with respect to the intermediate layer 6.

This underlayer 5 preferably includes an electroless plating layer formed by electroless plating. In the electroless plating, an operation for forming the electroless plating layer is simple, and the underlayer can be inexpensively formed.

This underlayer 5 may be constituted in a single layer alone or a plurality of layers. By the above-described electroless plating, the thickness of the underlayer 5 is arbitrarily changed, and a slit width can be narrowed to such an extent that a final desired slit width can be obtained by chemical vapor deposition (CVD) described later.

It is to be noted that an R shape having a predetermined curvature radius can be imparted to an intersection where the slits intersect with one another by this electroless plating.

The intermediate layer 6, disposed in such a manner as to coat at least a part of the underlayer 5, is constituted of tungsten carbide particles containing a main component of $W_3C$ and having an average particle diameter of 5 µm or less. The layer can be formed, for example, by chemical vapor deposition (CVD), specifically by thermal CVD or plasma CVD. A specific method for forming the intermediate layer 6 by the chemical vapor deposition (CVD) will be described in an embodiment of a method of manufacturing the die for forming the honeycomb structure described later. It is to be noted that the above-described "main component" is a component having a largest content (mass %) among components contained in tungsten carbide particles.

Moreover, at least one selected from the group consisting of $W_2C$, WC, and W may be contained in the tungsten carbide particles. The tungsten carbide particles may be any of crystal particles, amorphous particles, or mixed crystal particles.

In the die 1 for forming the honeycomb structure of the present embodiment, the tungsten carbide particles need to have an average particle diameter of 5 µm or less. When the particle diameters of the tungsten carbide particles decrease, smoothness of the surface of the intermediate layer 6 is further superior. Therefore, a maximum particle diameter of the tungsten carbide particles is preferably 6 µm or less, further preferably 5 µm or less, further preferably 1 µm or less, and especially preferably 0.5 µm or less. The average particle diameter of the tungsten carbide particles is 5 µm or less, preferably 3 µm or less, further preferably 2 µm or less, further preferably 0.5 µm or less, especially preferably 0.4 µm or less, and especially preferably 0.1 µm or less. When the smoothness of the surface of the intermediate layer 6 is further superior, the smoothness of the surface layer 7 disposed on the layer is also enhanced, the pressure resistance of the die 1 for forming the honeycomb structure is reduced, and sophisticated formability can be realized.

There is not any special restriction as to thickness of the intermediate layer 6. To obtain further satisfactory smoothness and wear resistance of the intermediate layer 6 surface, and further satisfactory adhesiveness with respect to the underlayer 5 and the surface layer 7, the thickness of the intermediate layer 6 is preferably 0.1 to 30 µm, further preferably 0.1 to 20 µm, especially preferably 0.1 to 15 µm.

Moreover, the intermediate layer 6 may be constituted of a single layer alone, or a plurality of layers. Therefore, the thickness of the intermediate layer 6 can be controlled by the number of the layers, but the layer is preferably constituted of one layer alone from a viewpoint of simplification of manufacturing steps.

The surface layer 7, disposed in such a manner as to coat at least a part of the intermediate layer 6, is constituted of diamond and/or diamond-like carbon, and can be formed, for example, by chemical vapor deposition (CVD), specifically by plasma CVD. As described above, in the present embodiment, the die 1 for forming the honeycomb structure is superior in the smoothness of the surface of the intermediate layer 6 disposed under the surface layer 7, high smoothness of the intermediate layer 6 surface is reflected, and the smoothness of the surface layer 7 is also enhanced. Therefore, in the die 1 for forming the honeycomb structure of the present embodiment, pressure resistance can be reduced at an extruding time to realize sophisticated formability. As to a specific method for forming the surface layer 7 by the above-described chemical vapor deposition (CVD), the method will be described in an embodiment of a method of manufacturing the die for forming the honeycomb structure described later.

There is not any special restriction as to the thickness of the surface layer 7. However, to obtain especially superior wear resistance, satisfactory smoothness, and satisfactory adhesiveness with respect to the intermediate layer 6, the thickness of the surface layer 7 is preferably 0.01 to 20 µm, further preferably 0.1 to 10 µm, especially preferably 0.1 to 5 µm.

Moreover, the surface layer 7 may be constituted of a single layer alone, or a plurality of layers.

Moreover, in the die 1 for forming the honeycomb structure of the present embodiment, the surface layer 7 is disposed in such a manner as to coat at least a part of the portion constituting the back holes 3 and the slits 4. The surface layer is preferably disposed in such a manner as to include the portion in which the back hole 3 communicates with the slit 4 on the die substrate 2. A size of an opening diameter of the back hole 3 is different from the width of the slit 4 in the portion in which the back hole 3 communicates with the slit 4. Therefore, the green material is limited in performing the extruding, and much more wear is generated as compared with another portion. Since the above-described surface layer 7 is constituted of diamond and/or diamond-like carbon superior in wear resistance, the surface layer 7 is disposed in such a manner as to include the portion in which more wear is generated and the back hole 3 communicates with the slit 4 on the die substrate 2. Consequently, the wear resistance of the die 1 for forming the honeycomb structure can be satisfactorily enhanced.

Next, the embodiment of the method of manufacturing the die for forming the honeycomb structure will be described according to the present invention.

In the present embodiment, the method of manufacturing the die for forming the honeycomb structure is a method of manufacturing the die 1 for forming the honeycomb structure shown in FIG. 1. First, the back holes 3, which introduce the green material for forming the honeycomb structure 10 (see FIG. 3), are formed in one surface 8 of a plate-like member having two surfaces. The slits 4 which communicate with the back holes 3 are formed in the other surface 9 of this plate-like member to obtain a die substrate (die substrate 2) in which the slits are formed.

Next, the underlayer 5 is formed on at least a part of a portion in which the back holes 3 and the slits 4 are formed on the obtained slit-formed die substrate by a process including electroless plating to obtain the die substrate provided with the underlayer.

Next, the intermediate layer 6, constituted of the tungsten carbide particles containing a main component of $W_3C$ and having an average particle diameter of 5 μm or less, is formed on at least a part of the underlayer 5 of the obtained die substrate provided with the underlayer by chemical vapor deposition (CVD) using a first reactive gas containing tungsten hexafluoride ($WF_6$), benzene ($C_6H_6$), and hydrogen ($H_2$) to obtain the die substrate provided with the intermediate layer.

Next, the surface layer 7, constituted of diamond and/or diamond-like carbon, is formed on at least a part of the intermediate layer 6 of the obtained die substrate provided with the intermediate layer by chemical vapor deposition (CVD) using a second reactive gas containing hydrogen carbide to manufacture the honeycomb structure forming die 1 for extruding the honeycomb structure.

By this constitution, it is possible to manufacture the die 1 for forming the honeycomb structure, which is superior in the wear resistance and which can reduce the pressure resistance to realize the sophisticated formability.

Each step will be described hereinafter in more detail. First, in the method of manufacturing the die for forming the honeycomb structure in the present embodiment, the back holes 3, which introduce the green material for forming the honeycomb structure 10 (see FIG. 3), are formed in one surface 8 of the plate-like member having two surfaces 8, 9, for example, by electrochemical machining (ECM), electric discharge machining (EDM), drilling or the like which has heretofore been known. The slits 4 which communicate with the back holes 3 are formed in the other surface 9 of this plate-like member, for example, by the electrochemical machining (ECM), electric discharge machining (EDM), drilling or the like which has heretofore been known to obtain a die substrate (die substrate 2) in which the slits are formed. With regard to this plate-like member, a plate-like member of a metal, an alloy or the like is preferably used which has a thickness to such an extent that the back holes 3 are formed in one surface 8, and slits 4 communicating with the back holes 3 can be formed in the other surface 9. Examples of the plate-like member preferably include plate-like members formed of stainless steel, die steel and the like.

In the method of manufacturing the die for forming the honeycomb structure of the present embodiment, the underlayer 5, the intermediate layer 6, and the surface layer 7 are disposed in this order on at least a part of the die substrate 2 as in the die 1 for forming the honeycomb structure shown in FIG. 1. Therefore, the slits 4 and the back holes 3 to be formed in the plate-like member are preferably formed to be larger in such a manner that the sizes (widths) of the slit 4 and the back hole 3 are slightly larger than those of the slit 4 and the back hole 3 having the final shapes in the position where at least one of the underlayer 5, the intermediate layer 6, and the surface layer 7 is disposed, that is, in consideration of the respective thicknesses of the underlayer 5, the intermediate layer 6, and the surface layer 7, and the positions where the layers are to be disposed. It is to be noted that there is not any restriction as to the order in which the slit 4 and the back hole 3 are formed in the plate-like member, and either of the slit and the hole may be formed first.

Next, the underlayer 5 is formed on at least a part of the portion in which the back holes 3 and the slits 4 are formed on the obtained slit-formed die substrate by a process including electroless plating to obtain the die substrate provided with the underlayer. In the electroless plating, a plating solution for use contains at least one metal selected from a group consisting of nickel, cobalt, and copper, and a reducing agent such as sodium hypophosphite and sodium boron hydroxide. The solution is heated at about 80 to 100° C., and the die substrate in which the slits are formed is submerged into the plating solution for a predetermined time.

It is to be noted that by this electroless plating, the thickness of the underlayer 5 is arbitrarily changed, and the slit width can be narrowed to such an extent that a final desired slit width can be obtained by chemical vapor deposition (CVD) described later. Moreover, the R shape having a predetermined curvature radius can be imparted to the intersection where the slits intersect with one another.

Moreover, in this step including the electroless plating, an oxide layer is preferably prevented from being mixed if possible. Examples of a method for preventing the oxide layer from being mixed include a method in which the underlayer 5 is formed by continuous electroless plating. It is also effective to perform the electroless plating in an inactive gas atmosphere. After forming one underlayer 5 by the electroless plating, another underlayer 5 may be formed by the electroless plating.

Furthermore, after forming the underlayer 5 by the electroless plating in this manner, acid cleaning may be performed by dilute nitric acid, acetic acid or the like with respect to the surface of the underlayer 5. It is to be noted that this acid cleaning is preferably performed in an inactive gas atmosphere in order to prevent the oxide layer from being formed on the underlayer 5 effectively.

Moreover, the step including the electroless plating is preferably performed while measuring, in the plating solution, the width of the slit 4 of the slit-formed die substrate on which the underlayer 5 is being formed. Alternatively, instead of directly measuring the width of the slit 4, a slit having a width equal to that of the slit-formed die substrate is formed in a dummy piece, the piece is submerged in the plating solution, and the step including the electroless plating may be performed while measuring the width of the slit in this dummy piece.

Next, the obtained die substrate provided with the underlayer is disposed, for example, in a reaction chamber for performing chemical vapor deposition (CVD) to form the intermediate layer 6 constituted of the tungsten carbide particles containing a main component of $W_3C$ and having an average particle diameter of 5 μm or less by chemical vapor deposition (CVD) using a first reactive gas containing tungsten hexafluoride ($WF_6$), benzene ($C_6H_6$), and hydrogen ($H_2$), specifically by thermal CVD or plasma CVD.

Conditions of the chemical vapor deposition (CVD) differ with the thickness or the like of the formed intermediate layer 6. For example, the deposition is performed by the thermal CVD preferably at a temperature of 310 to 420° C. and a pressure of 1 to 35 Torr, further preferably at a temperature of 310 to 380° C. and a pressure of 1 to 30 Torr, especially preferably at a temperature of 340 to 360° C. and a pressure of 1 to 30 Torr. When the temperature of the chemical vapor deposition (CVD) is less than 310° C., the intermediate layer 6 mixed with tungsten (W) at a high ratio is sometimes formed, and reactivity of the first reactive gas sometimes drop. When the temperature of the chemical vapor deposition (CVD) exceeds 420° C., and the intermediate layer 6 non-uniformly mixed with $W_2C$ at a high ratio is sometimes formed in addition to $W_3C$, where $W_2C$ has a comparatively large particle diameter. When the pressure exceeds 35 Torr, a partial pressure of the first reactive gas increases, the reactivity increases, and the intermediate layer 6 non-uniformly mixed with $W_2C$ at a high ratio is sometimes formed in addition to $W_3C$, where $W_2C$ has a comparatively large particle diameter.

When the chemical vapor deposition (CVD) is performed, it is preferable to perform the chemical vapor deposition (CVD) using the first reactive gas in a state in which a pressure difference is made between one surface 8 side and the other surface 9 side of the die substrate constituting the die substrate provided with the underlayer. By this constitution, the first reactive gas is satisfactorily supplied to a space in which the slit 4 and the back hole 3 are formed, and reaction efficiency of the chemical vapor deposition (CVD) can be enhanced.

Moreover, examples of a component other than $W_3C$ preferably include at least one selected from the group consisting of $W_2C$, WC, and W. It is to be noted that the tungsten carbide particles may be any of crystal particles, amorphous particles, and mixed crystal particles.

There is not any special restriction as to the thickness of the intermediate layer 6. To obtain further satisfactory smoothness and wear resistance of the intermediate layer 6 surface, and further satisfactory adhesiveness with respect to the underlayer 5 and the surface layer 7, the thickness of the intermediate layer 6 is preferably 0.1 to 30 μm, further preferably 0.1 to 20 μm, especially preferably 0.1 to 15 μm.

As described above, the first reactive gas contains tungsten hexafluoride ($WF_6$), benzene ($C_6H_6$), and hydrogen ($H_2$). To enhance efficiency of the intermediate layer 6 formed by the chemical vapor deposition (CVD), components are preferably adjusted in such a manner that a ratio (W/C) of a mole number of a tungsten element (W) is in a range of 0.6 to 6 with respect to that of a carbon element (C) in the first reactive gas. This ratio (W/C) of the mole number is in a range of further preferably 0.6 to 5, especially preferably 0.6 to 3.

Next, the obtained die substrate provided with the intermediate layer is disposed, for example, in a reaction chamber for performing the chemical vapor deposition (CVD), and the surface layer 7, constituted of diamond and/or diamond-like carbon, is formed by the chemical vapor deposition (CVD) using a second reactive gas containing hydrogen carbide, specifically the plasma CVD to manufacture the die 1 for forming the honeycomb structure.

Moreover, when the plasma CVD is performed to form the surface layer 7, a pulse voltage is preferably applied to the die substrate provided with the intermediate layer to generate a plasma. By this constitution, the surface layer 7 can be satisfactorily formed on the intermediate layer 6. Furthermore, the pulse voltage is preferably applied to the die substrate provided with the intermediate layer without substantially applying a direct-current bias voltage. When the direct-current bias voltage is not substantially applied, the surface layer 7 can be formed more stably. It is to be noted that when the direct-current bias voltage is not substantially applied, an operation is not performed for applying the direct-current bias voltage from a power supply capable of applying the direct-current bias voltage to the die substrate provided with the intermediate layer. For example, from another cause, a direct-current potential difference is sometimes made between the die substrate provided with the intermediate layer and the power supply. However, in this case, the direct-current bias voltage is not substantially applied.

When the pulse voltage is applied as described above, for example, an electric field has a magnitude of preferably 20 to 300 kV/m, further preferably 20 to 200 kV/m. There is not any special restriction as to the pulse width of the pulse voltage, and, for example, the width is preferably in a range of 1 to 50 μs. There is not any special restriction as to a pulse period of the pulse voltage, and, for example, the period is preferably in a range of 100 to 10000 Hz.

As described above, according to the method of manufacturing the die for forming the honeycomb structure of the present embodiment, there can be provided the die for forming the honeycomb structure, which is superior in wear resistance and formability, and the method can contribute to the enhancement of the productivity.

EXAMPLES

The present invention will be described hereinafter in accordance with examples in more detail, but the present invention is not limited to the following examples.

Example 1

A die for forming a honeycomb structure was manufactured comprising: a plate-like die substrate having at least two surfaces, one surface including a back hole for introducing a green material, the other surface including a slit communicating with the back hole; an underlayer disposed on the die substrate in such a manner as to coat at least a part of a portion constituting the back hole and the slit; an intermediate layer disposed in such a manner as to coat at least a part of the underlayer and constituted of tungsten carbide particles containing a main component of $W_3C$ and having an average particle diameter of 5 μm or less; and a surface layer disposed in such a manner as to coat at least a part of the intermediate layer and constituted of diamond and/or diamond-like carbon.

Specifically, first a back hole having an opening diameter of 1.00 mm was formed in one surface of a plate-like member having two surfaces and formed of a SUS steel. Moreover, a slit communicating with the back hole and having a width of 180 μm was formed in the other surface of the plate-like member to obtain a die substrate in which the slits were formed.

Next, one plating step was performed to continue electroless plating, and an underlayer having a thickness of about 40 μm was formed to obtain the die substrate provided with the underlayer.

Next, the obtained die substrate provided with the underlayer was left to stand in a reaction chamber for chemical vapor deposition, a reactive gas containing $WF_6$, $C_6H_6$, and $H_2$ (W/C mol ratio: 0.8) was supplied, chemical vapor deposition (CVD) was performed at a treatment temperature of about 350° C., and an intermediate layer having a thickness of about 15 μm was formed to obtain the die substrate provided with the intermediate layer.

Next, the obtained die substrate provided with the intermediate layer was left to stand in a reaction chamber for plasma CVD, a $C_2H_2$ gas was introduced at a flow rate of 20 cm$^3$/min, and a pulse voltage was applied to the die substrate provided with the intermediate layer without substantially applying any direct-current bias voltage to perform the plasma CVD. Accordingly, a surface layer having a thickness of about 3 μm was formed, and a die (Example 1) for forming a honeycomb structure was manufactured.

In Example 1, the die for forming the honeycomb structure had a slit width of about 65 μm, and a corner portion, formed in a portion in which lattice forming slits intersected with each other, had an R-shape having a curvature radius of about 60 μm.

In the die for forming the honeycomb structure of Example 1, the die substrate provided with the formed intermediate layer had a uniform gloss, and the intermediate layer was constituted of tungsten carbide particles having a particle diameter of 0.5 μm or less and an average particle diameter of 0.1 μm. When the surface layer was formed on the die substrate provided with the intermediate layer, the surface layer turned to black. When the surface of the portion in which the surface layer was formed was observed with an electronic microscope, a surface state of the intermediate layer was traced to form the surface layer, and the surface layer had a surface shape superior in smoothness. When a green material containing cordierite was extruded using the die for forming the honeycomb structure of Example 1, it was possible to extrude a honeycomb structure having a partition wall thickness of about 65 μm without generating any forming defect or the like.

Comparative Example 1

Chemical vapor deposition was performed at a treatment temperature of about 750° C., and a TiCN underlayer was formed to form a die substrate provided with the underlayer. A surface layer constituted of diamond and/or diamond-like carbon and having a thickness of 3 μm was formed on the die substrate provided with the underlayer in the same manner as in Example 1, and a die (Comparative Example 1) for forming a honeycomb structure was manufactured. In the die for forming the honeycomb structure of Comparative Example 1, a width of a slit, a curvature radius of a portion in which lattice forming slits intersected with each other and the like were set to be equal to those of the die for forming the honeycomb structure of Example 1.

In the die for forming the honeycomb structure of Comparative Example 1, the die substrate provided with the underlayer hardly had a gloss, and the die turned to black after forming the surface layer. When the surface of a portion, in which the surface layer was formed, was observed with an electronic microscope, the whole die was constituted of needle crystals having a long diameter of 10 μm or less and a short diameter of 3 μm or less, and crystal sizes had a slightly non-uniform distribution. A surface state of the TiCN underlayer was traced to form the surface layer. A surface having a large surface roughness was formed as compared with the die for forming the honeycomb structure of Example 1. Deformation of the slits by an influence of the treatment temperature was confirmed. When a green material containing cordierite was extruded using the die for forming the honeycomb structure of Comparative Example 1, pressure resistance was high, and formability dropped as compared with a formed article of Example 1.

Comparative Example 2

A die substrate provided with an underlayer was constituted in the same manner as in the die substrate provided with the underlayer of Example 1. The substrate was left to stand in a reaction chamber for chemical vapor deposition, and a reactive gas containing $WF_6$, $C_6H_6$, and $H_2$ (W/C mol ratio: 0.8) was supplied. The chemical vapor deposition was performed at a treatment temperature of about 350° C. to form, as a surface layer, a layer (intermediate layer in Example 1) constituted of tungsten carbide particles mainly composed of $W_3C$ and having an average particle diameter of 0.1 μm. Accordingly, a die (Comparative Example 2) for forming a honeycomb structure was manufactured. In the die for forming the honeycomb structure of Comparative Example 2, a width of a slit, a curvature radius of a portion in which lattice forming slits intersected with each other and the like were set to be equal to those of the die for forming the honeycomb structure of Example 1.

In the die for forming the honeycomb structure of Comparative Example 2, when a surface state was observed with an electron microscope, the surface layer (intermediate layer in Example 1) was constituted of tungsten carbide particles having a particle diameter of 0.5 μm or less and an average particle diameter of 0.1 μm, and had a surface shape superior in smoothness. When a green material containing cordierite was extruded using the die for forming the honeycomb structure of Comparative Example 2, the honeycomb structure having a partition wall thickness of about 65 μm was extruded without generating any forming defect or the like. However, it was found that the die for forming the honeycomb structure of Comparative Example 2 had a low wear resistance, and wear proceeded at a speed about 1.5 times that of the die for forming the honeycomb structure of Example 1.

According to the present invention, a die for forming a honeycomb structure is superior in wear resistance, and can reduce pressure resistance to realize sophisticated formability. According to a method of manufacturing a die for forming a honeycomb structure of the present invention, the above-described die for forming the honeycomb structure can be provided, and the present invention can contribute to enhancement of productivity.

What is claimed is:

1. A die for forming a honeycomb structure comprising:
   a plate-like die substrate having at least two surfaces, one surface including a back hole for introducing a green material, the other surface including a slit formed in such a manner as to communicate with the back hole and in which the green material introduced into the back hole is extruded from the slit to form the honeycomb structure;
   an underlayer disposed on the die substrate in such a manner as to coat at least a part of a portion constituting the back hole and the slit;
   an intermediate layer disposed in such a manner as to coat at least a part of the underlayer and constituted of tungsten carbide particles containing a main component of $W_3C$ and having an average particle diameter of 5 μm or less; and
   a surface layer which is disposed in such a manner as to coat at least a part of the intermediate layer and which is constituted of at least one of diamond and diamond-like carbon.

2. The die for forming the honeycomb structure according to claim 1, wherein the surface layer is disposed on the die substrate in such a manner as to include a portion where the back hole communicates with the slit.

3. The die for forming the honeycomb structure according to claim 1, wherein thickness of the underlayer is in a range of 1 to 100 μm.

4. The die for forming the honeycomb structure according to claim 1, wherein thickness of the intermediate layer is in a range of 0.1 to 30 μm.

5. The die for forming the honeycomb structure according to claim 1, wherein thickness of the surface layer is in a range of 0.01 to 20 μm.

6. The die for forming the honeycomb structure according to claim 2, wherein thickness of the surface layer is in a range of 0.01 to 20 μm.

7. The die for forming the honeycomb structure according to claim 1, wherein the tungsten carbide particles constituting the intermediate layer has a maximum particle diameter of 6 μm or less.

8. The die for forming the honeycomb structure according to claim 4, wherein the tungsten carbide particles constituting the intermediate layer has a maximum particle diameter of 6 μm or less.

9. The die for forming the honeycomb structure according to claim 1, wherein the underlayer includes an electroless plating layer.

10. The die for forming the honeycomb structure according to claim 1, wherein the intermediate layer is formed by chemical vapor deposition (CVD).

11. The die for forming the honeycomb structure according to claim 1, wherein the surface layer is formed by chemical vapor deposition (CVD).

12. A method of manufacturing a die for forming a honeycomb structure, comprising the steps of:

forming a back hole which introduces a green material for forming the honeycomb structure in one surface of a plate-like member having two surfaces and forming a slit which communicates with the back hole in the other surface of the plate-like member to obtain a die substrate in which the slit is formed;

forming an underlayer on at least a part of a portion in which the back hole and the slit are formed on the obtained slit-formed die substrate by a process including electroless plating to obtain the die substrate provided with the underlayer;

forming an intermediate layer constituted of tungsten carbide particles containing a main component of $W_3C$ and having an average particle diameter of 5 μm or less on at least a part of the underlayer of the obtained die substrate provided with the underlayer by chemical vapor deposition (CVD) using a first reactive gas containing tungsten hexafluoride ($WF_6$), benzene ($C_6H_6$), and hydrogen ($H_2$) to obtain the die substrate provided with the intermediate layer; and forming a surface layer constituted of at least one of diamond and diamond-like carbon on at least a part of the intermediate layer of the obtained die substrate provided with the intermediate layer by chemical vapor deposition (CVD) using a second reactive gas containing hydrogen carbide to manufacture the die for extruding the honeycomb structure.

13. The method of manufacturing the die for forming the honeycomb structure according to claim 12, wherein the chemical vapor deposition (CVD) for forming the intermediate layer is thermal CVD or plasma CVD.

14. The method of manufacturing the die for forming the honeycomb structure according to claim 13, wherein the intermediate layer is formed by the thermal CVD at a temperature of 310 to 420° C. and a pressure of 1 to 35 Torr.

15. The method of manufacturing the die for forming the honeycomb structure according to claim 12, wherein the chemical vapor deposition (CVD) for forming the surface layer is plasma CVD.

16. The method of manufacturing the die for forming the honeycomb structure according to claim 15, wherein the plasma CVD comprises the steps of: applying a pulse voltage to the die substrate provided with the intermediate layer.

* * * * *